US007340618B2

United States Patent
Kark et al.

(10) Patent No.: US 7,340,618 B2
(45) Date of Patent: Mar. 4, 2008

(54) SYSTEM AND METHOD FOR REGULATING SYSTEM POWER BY CONTROLLING MEMORY USAGE BASED ON AN OVERALL SYSTEM POWER MEASUREMENT

(75) Inventors: Kevin W. Kark, Poughkeepsie, NY (US); Liyong Wang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 11/081,115

(22) Filed: Mar. 16, 2005

(65) Prior Publication Data

US 2006/0212725 A1    Sep. 21, 2006

(51) Int. Cl.
*G06F 1/00* (2006.01)
(52) U.S. Cl. .................. 713/300; 713/340; 711/114
(58) Field of Classification Search .............. 713/300, 713/320, 322, 324, 340; 711/114
See application file for complete search history.

(56) References Cited

U.S. PATENT DOCUMENTS

| | | | | |
|---|---|---|---|---|
| 6,167,524 A | * | 12/2000 | Goodnow et al. ......... | 713/300 |
| 6,587,950 B1 | * | 7/2003 | Shah et al. ............... | 713/300 |
| 6,802,014 B1 | * | 10/2004 | Suurballe ................. | 713/300 |
| 2003/0079150 A1 | * | 4/2003 | Smith et al. .............. | 713/320 |
| 2004/0030944 A1 | * | 2/2004 | Barr et al. ............... | 713/400 |

* cited by examiner

*Primary Examiner*—Thomas Lee
*Assistant Examiner*—Mark Connolly
(74) *Attorney, Agent, or Firm*—Lynn L. Augspurger

(57) ABSTRACT

A power governor for DRAM in a multi-node computer system regulating memory power consumption of an entire computer system employs a closed ring that connects all the power governors within the system to enable them to work in concert so that each of the power governors has the knowledge of memory activities within the entire system. They then control and limit the memory usage based on a true overall measurement instead of just local measurement. Each nodal power governor has memory command counter, ring number receiver, ring number transmitter, governor activation controller, and memory traffic controller. Each nodal power governor counts the weight of memory command. The degree of limiting actual memory activities can be programmed when the governor is active. Besides, the command priorities can be adjusted in activation too. A hybrid ring structure can be employed with a nodal power structure to achieve the fastest number circulation speed economically.

11 Claims, 5 Drawing Sheets

New power governor design with a closed-ring communication path

Note: MSC stands for Main Storage Controller

Prior art of power governor design

New power governor design with a closed-ring communication path

Note: MSC stands for Main Storage Controller

Functional block diagram of each of the nodal power governors

An implementation example of a nodal power governor

An implementation example of ring connections between the power governors

SYSTEM AND METHOD FOR REGULATING SYSTEM POWER BY CONTROLLING MEMORY USAGE BASED ON AN OVERALL SYSTEM POWER MEASUREMENT

CROSS-REFERENCE TO RELATED APPLICATIONS

This application contains subject matter which is related to the subject matter of the following co-pending applications, each of which is assigned to the same assignee as this application, International Business Machines Corporation of Armonk, N.Y. Each of the below listed applications is hereby incorporated herein by reference in its entirety:

Method of Governing Power for multi-node computer system components, Liyong Wang et al, USSN 11/082,123, filed concurrently herewith.

TRADEMARKS

IBM® is a registered trademark of International Business Machines Corporation, Armonk, N.Y., U.S.A. and other names used herein may be registered trademarks, trademarks or product names of International Business Machines Corporation or other companies.

BACKGROUND OF THE INVENTION

1. Field of the Invention

This invention relates to application specific integrated circuit (ASIC) design and particularly to the ASICs having large capacity of DRAM in a multi-node computer system, that needs to restrain overall power consumptions.

2. Description of Background

Power consumption has been one of the major battle areas for today's digital chip and system design. Demand for faster chips and bigger DRAM capacity is pushing the power supply to its capacity limit. How to keep the average DRAM current consumption low while maintain high system performance and efficiency brings to a significant challenge to today's system design. Heretofore, IBM provided the power governor control logic for a RAM subsystem of a computer processor, by utilizing the control logic described in IBM U.S. Pat. No. 6,667,929 of Vesselina K. Zaharinova Papazova et al, incorporated herein by reference, which provides power governor control logic for a DRAM (Dynamic Random Access Memory) subsystem for indirectly measuring actual power consumption and decreasing the power consumption when the consumption exceeds a preset amount. This patent describes a way to count the number of memory accesses within a DRAM refresh period. If the total count exceeds a predefined threshold, then the power governor will be activated and thus slows down the subsequence memory access by artificially inserting idle commands between memory fetches and stores. Refer to FIG. 1 of this application for the block diagram of the implementation. The IBM z990 mainframe is the first system that equipped with this power governor. The z990 system has maximum capacity of four total nodes and each node can have up to four independent memory arrays. There are a maximum of eight power governors in a system to control those memory arrays independently.

Since those power governors work independently, they do not have the complete awareness of the power usage for the entire system. We have learned that in an extreme case, a single memory access could burst into just one memory array in a node, while other memory arrays in the system are idle. The power governor belonging to this particular memory array could be activated, and its subsequent memory accesses slow down. However, the average memory activities and total current consumption in the whole system might still be well under the limit. In this case, the memory performance deteriorates unnecessarily. The memory system is not running at its maximum throughput.

SUMMARY OF THE INVENTION

The shortcomings of the prior art we have discovered are addressed and additional advantages are provided through the provision of a method that enables all the power governors within the system to work in concert so that each of the power governors has the knowledge of overall memory activities for the entire system. As a result, they control and limit the memory usage based on a true overall system power measurement instead of just local measurement. Nevertheless, each of these power governors still has its own way to control/regulate its associated memory port. This preferred embodiment works well with various numbers of governors installed. It also supports a heterogeneous memory system, where different memory arrays have different memory technologies, which could drive different power requirement. It is a very flexible design that produces the maximum accuracy, efficiency and performance for the memory subsystem.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
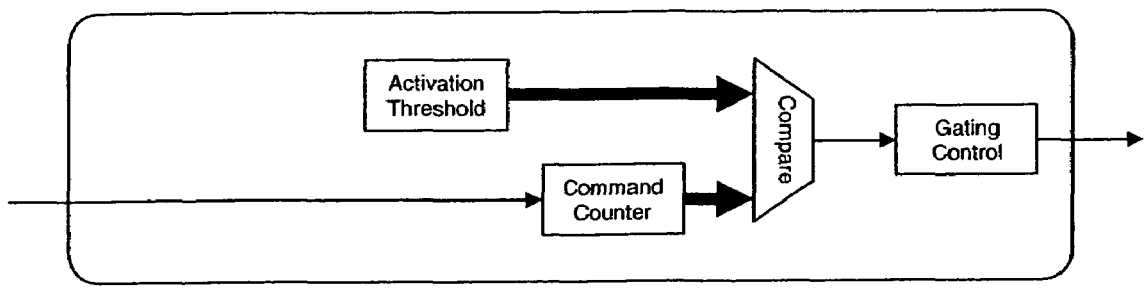
FIG. 1 illustrates one example of prior art of power governor design which we discussed in the background of the invention.
Figure 2:
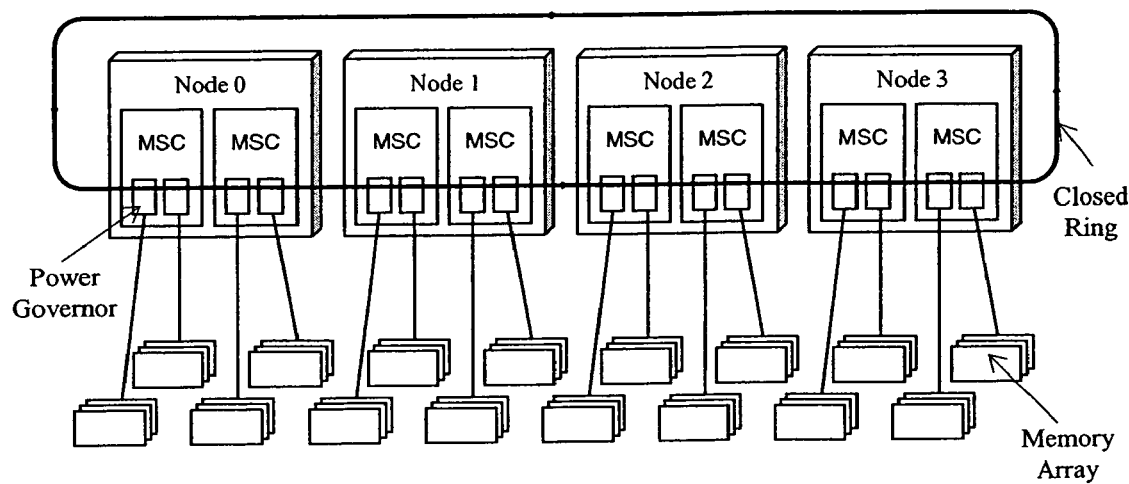
FIG. 2 illustrates a preferred example of the new power governor design, which establishes a closed-ring communication path among nodes.

As shown in our preferred embodiment of FIG. 2, in order to make all the power governors work together cohesively, we established a closed-ring communication path that runs across all the power governors in the system. As shown in FIG. 2 we have provided a plurality of nodes (0, 1, 2, 3) arranged in a ring, each having a plurality of memory system controller MSC interfaces to a DRAM memory array. Since it is a closed ring, each of the power governors has its predecessor and successor. There is a power usage number that circulates in this ring. The number represents the total measurement of memory commands that has been utilized so far within the system. The time interval that the number circulates through the ring once is defined as the number circulation period.

While the power usage number is circulating in the ring, each governor keeps counting on its local activities. Whenever the usage number arrives at a power governor, the governor adds its local measurement on top of the number and then passes it over to the successive governor. While doing so, the governor also saves this number locally so when the number circulates back to the same governor again, it will be able to determine the increment between the new number and the saved number. This power increment approximately equals to the total measurement of DRAM commands sent out in other governors during a number circulation period.

The governor then keeps accumulating this power increment into periodic power number. At the end of counting period, the governor compares the periodic power number with a predefined threshold value to make a determination. If the number exceeds the threshold, the governors will be activated and start regulating subsequent memory access.

Figure 3:
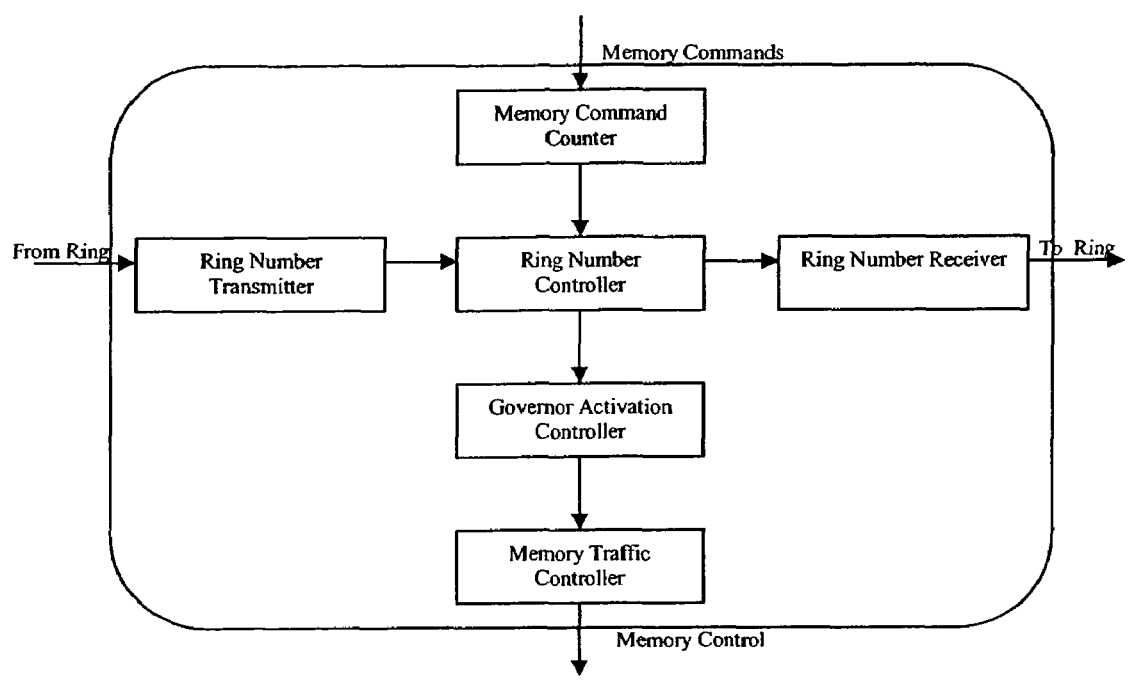
FIG. 3 illustrates the functional block diagram of each of the nodal power governors.

Implementation of the nodal power governor. Refer to FIG. 3 for the block diagram. Each nodal power governor consists of the following units:

1. memory command counter
2. ring number receiver
3. ring number transmitter
4. ring number handler
5. governor activation controller
6. memory traffic controller The memory command counter unit 1 counts all the commands that have been out to memory within a number circulation period. Since the number circulating in the ring goes through every power governors in the system and each power governor could be regulating different types of memory, we need to unify the counting algorithm among all the governors and make it valid to all the memory configurations. To accomplish this, the counting unit counts the weights of the memory commands. The memory command weights vary based on the actual power usage of each type of commands, which are chosen from industry standard memory commands such as memory active, fetch, store, and refresh. Also, each power governor within the system could be set to have different weight based on the technology of a particular memory attached. This makes the counting more accurate to match the real power usage.

The ring number receiver 2 receives the total system power usage number from the predecessor of the current power governor. The receiver 2 is able to receive the power usage number in various supported formats. Once fully received, the number will be sent to the ring number handler for further process.

The ring number transmitter 3 sends the total system power usage number, which is received from the ring number handler 4 to the successor of the current power governor. The ring number transmitter 3 is able to send out the number in various formats, depended upon implementation.

The ring number handler 4 has two functions. The first function is taking the incoming memory usage number, adding it with the local memory usage measurement, sending the result to ring number transmitter, and saving the result in local for future usage. The second function is calculating the total system memory usage within a number circulation period. It subtracts the total result with the usage number it previously saved. The difference will be the accumulated total command activities within a number circulation period. It then sends this result to governor activation controller 5 to do the accumulation and comparison.

The governor activation controller 5 first adds the power usage number that comes from the ring number handler 4 to its locally saved total number. At the end of the counting period, it then compares this total with a predefined threshold that is based on overall system power consumption requirement. If the total is greater than the threshold, it will send a signal to memory traffic controller to active the power governor.

The counting period is programmable and independent to memory refresh interval. The memory refresh interval is a DRAM parameter within which a memory refresh command must be received by DRAM. This separation of counting period versus memory refresh internal makes the implementation of the multi-node power governor independent to memory technology. The counting period also has some effect on the power governor behavior. The shorter the counting period is, the faster the power governor will react to the power consumption changes. On the other hand, the longer the period is, the more accurate the power governor will be.

The memory traffic controller 6 is used to limit the memory access if the governor is activated. Two functions are implemented with the memory traffic controller:

1. The controller 6 artificially inserts idle commands in between the real memory operations. The minimum number of idle commands inserted is programmable and can be setup independently in each of the power governors based on real needs and situation. This will affect the slow-down degree of memory activities.

2. The controller 6 adjusts the command priority when the power governor is active. In a z990 memory subsystem, there are 4 types of memory commands: key fetch, key store, data fetch and data store. Since key ops are more critical than data ops, it is generally desired not to slow down key operations as much as data operations when the power governor is active. The memory traffic controller 6 has the ability to adjust priority of each command category independently when it becomes active.

Figure 4:
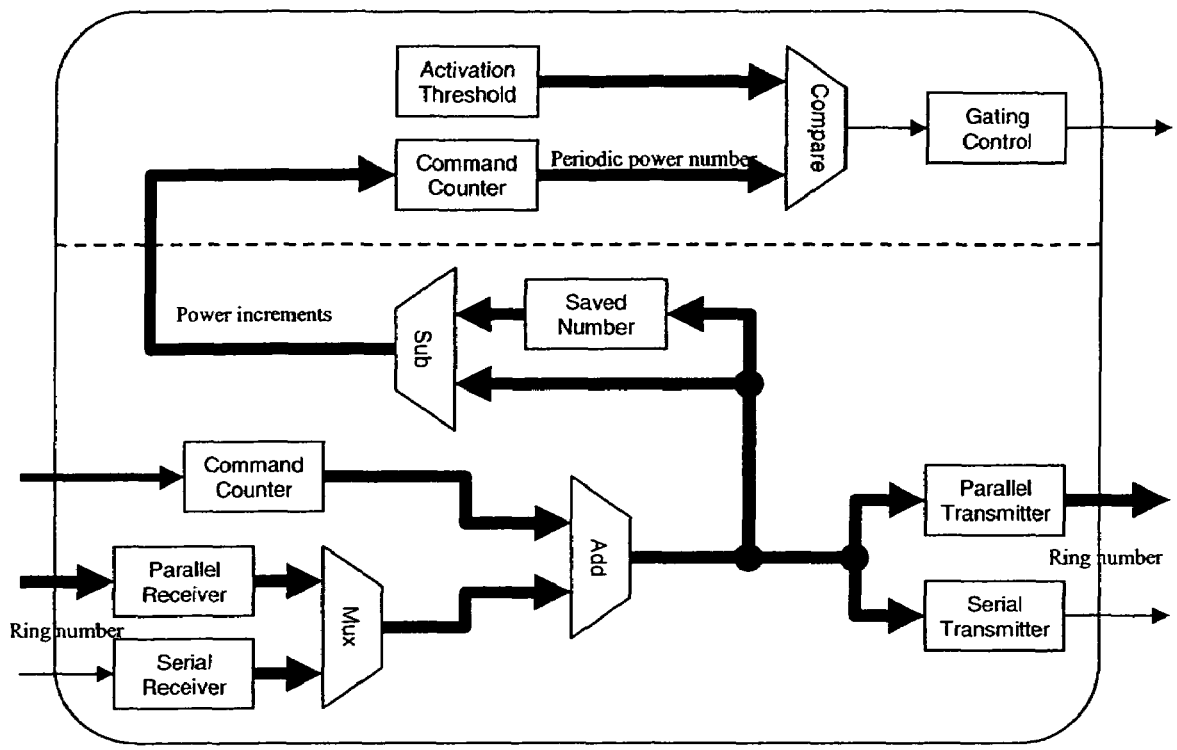
FIG. 4 illustrates a preferred example of an implementation of a nodal power governor.

Refer to FIG. 4 for an example of how a nodal power governor is implemented.

Ring Implementation. The ring implementation can be very flexible. Each connection between the nodes can be in different type to each other, thus the ring can be hybrid. The main goal is to keep the total circulation time as low as possible, while balance with packaging cost and efficiency.

Figure 5:
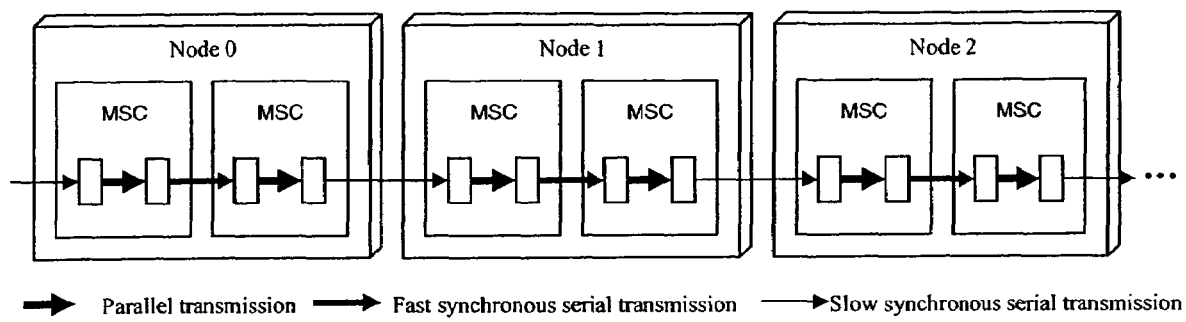
FIG. 5 illustrates a preferred example of implementations of ring connections between the power governors.

A preferred design implementation for a possible IBM system is shown in FIG. 5. The implementation is trying to expedite the circulation speed of the memory usage number as well as minimize the wire connections between each chips and nodes. A hybrid ring mixed with serial and parallel transmission is implemented. The serial transmission is synchronous.

Within a chip, the link between the two power governors is parallel, so the data can be transmitted with 1 or 2 chip cycles.

Between the two different chips within a node, the connection is a fast serial transmission. Only one wire is required for this type of communication. The bits are transmitted in serial fashion at chip clock speed. Generally it takes about 20 cycles to get the data across.

Between the two nodes, the connection is a slow serial transmission due to the long wire length. Similar to the fast serial transmission, only one wire is required for this type of communication. But the signals run at lower speed. Generally it takes about 100 cycles to get the data across the nodes.

So for a fully populated 4-node system, the estimated message circulating period is 500 cycles based on this example.

The capabilities of the present invention can be implemented in software, firmware, hardware or some combination thereof.

As one example, one or more aspects of the present invention can be included in an article of manufacture (e.g., one or more computer system products) having, for instance, computer usable media. The media has embodied therein, for instance, computer readable program code means for providing and facilitating the capabilities of the present invention. The article of manufacture can be included as a part of a larger distributed computer system or sold separately.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for regulating system power in a computer system, comprising: providing a plurality of power governors for power governor units of said computer system, each governor unit including a controller node having multiple control elements and each of said multiple control elements being coupled to remote computer system memory elements forming a memory array coupled to each power governor units own memory port, and enabling each of said power governor units to communicate and work in concert with other power governors in said computer system to regulate system power based on overall system power usage, and controlling and limiting memory usage based on an overall system power measurement including said plurality of governor units while each power governor unit maintains control and regulation of its own associated memory port, wherein said power governor units are coupled to one another on a closed-ring communication path established between nodes.

2. The method according to claim 1 wherein said closed-ring communication path is used by all the power governors for memory arrays of said computer system to communicate each other to determine the overall system power usage.

3. The method according to claim 2 wherein in said closed ring communication path, each of the power governors has its predecessor and successor and a power usage number circulates in this ring and represents the total activity measurement of memory commands that has been utilized so far within the system, and wherein a time interval that the number circulates through the ring once is defined as a number circulation period, whereby as said power usage number circulates in the ring, the power usage number represents the total accumulated memory activities.

4. The method according to claim 3 wherein each power governor adds its locally-counted memory power activity number onto this total memory usage number when the power usage number passes it in said ring.

5. The method according to claim 3 wherein each power governor can determine the overall system memory usage within a number circulation period from the power usage number in the ring.

6. The method according to claim 3 wherein each power governor regulates the memory activities within its control based the comparison of total power usage within a counting period and a predefined threshold.

7. The method according to claim 3 wherein a programmable command counting period is provided for a power governor unit which is independent of a memory refresh period.

8. The method according to claim 7 where said power governor units are supplied a set of programmable command weights for different kind of industry standard memory operations, including memory active, memory fetch and memory store.

9. The method according to claim 7 wherein said power governor is supplied with a programmable number of idle commands that can be inserted between the power governor unit's real memory operations, and wherein said programmable number can also be set differently in each of the power governors in said computer system.

10. The method according to claim 7 wherein said power governor is provided with a first set of different memory command priorities in the case with power governor active than with a second set of different memory command priorities when the power governor is not active.

11. The method according to claim 1 wherein a hybrid connection is provided within the closed ring.

* * * * *